United States Patent [19]

Dorothy

[11] Patent Number: 5,567,330
[45] Date of Patent: Oct. 22, 1996

[54] ELECTRICAL INTERCONNECT STRUCTURES AND PROCESSES

[75] Inventor: Robert G. Dorothy, Kennett Square, Pa.

[73] Assignee: E. I. Du Pont de Nemours and Company, Wilmington, Del.

[21] Appl. No.: 324,064

[22] Filed: Oct. 17, 1994

Related U.S. Application Data

[63] Continuation-in-part of Ser. No. 80,463, Jun. 21, 1993, abandoned, which is a continuation-in-part of Ser. No. 992,275, Dec. 15, 1992, abandoned.

[51] Int. Cl.$^6$ .............................. B44C 1/22; C03C 15/00
[52] U.S. Cl. ................... 216/18; 216/33; 216/66; 216/67; 216/65; 505/411; 505/412; 505/413
[58] Field of Search ....................... 216/3, 18, 39, 216/101, 65, 67, 66, 33, 76; 505/410, 411, 412, 413, 728, 816, 820; 257/35; 437/187, 228 SE, 228 PE, 910

[56] References Cited

U.S. PATENT DOCUMENTS

| | | | |
|---|---|---|---|
| 4,474,828 | 10/1984 | Young et al. ............... | 437/910 X |
| 4,751,482 | 6/1988 | Fukuta et al. ............... | 333/247 |
| 4,827,327 | 5/1989 | Miyauchi et al. ............ | 357/725 |
| 4,837,609 | 6/1989 | Gurvitch et al. ............. | 357/71 |
| 4,942,142 | 7/1990 | Itozaki et al. ................ | 505/1 |
| 4,954,480 | 9/1990 | Imanaka et al. .............. | 505/1 |
| 4,980,339 | 12/1990 | Setsune et al. ............... | 505/1 |
| 5,057,877 | 10/1991 | Briley et al. .................. | 357/5 |
| 5,087,605 | 2/1992 | Hedge et al. .................. | 505/1 |
| 5,159,347 | 10/1992 | Osterwalder .................. | 343/71 |
| 5,462,762 | 10/1995 | Onuma et al. ................. | 216/3 X |

FOREIGN PATENT DOCUMENTS

| | | |
|---|---|---|
| 0358879 | 3/1990 | European Pat. Off. . |
| 59-144190 | 8/1984 | Japan . |
| 64-67984 | 3/1989 | Japan . |
| 1-158757 | 6/1989 | Japan . |
| 1-157007 | 6/1989 | Japan . |
| 2-37785 | 2/1990 | Japan . |
| WO92/20108 | 11/1992 | WIPO . |

OTHER PUBLICATIONS

Hung, L. S. et al, *J. Appl. Phys.*, 66(1) (Jul. 1, 1989).
Siegal, M. P. et al, *Physica C* 172, 282–286 (1990).
Jia, C. L. et al, *Physica C* 175, 545–554 (1991).

*Primary Examiner*—William Powell

[57] ABSTRACT

Electrical interconnect structures comprised of high temperature superconducting signal layers on a substrate bonded to one another or optionally to a base substructure containing power and ground planes and processes for their preparation are disclosed.

17 Claims, 2 Drawing Sheets

ELECTRICAL INTERCONNECT STRUCTURES AND PROCESSES

CROSS-REFERENCE TO RELATED APPLICATIONS

This application is a continuation-in-part of U.S. Ser. No. 08/080,463 filed Jun. 21, 1993, now abandoned, which is a continuation-in-part of U.S. Ser. No. 07/992,275 filed Dec. 15, 1992, currently abandoned.

FIELD OF THE INVENTION

This invention relates to electrical interconnect structures comprised of at least one high temperature superconducting signal layer on a substrate subsequently bonded to one another and optionally to a base substructure containing power and ground planes and processes for their preparation.

BACKGROUND OF THE INVENTION

Continuing advances in the design of electronic circuits and circuit elements has led to a need for multichip packaging which provides high chip densities, shorter interconnections and higher yields. Multichip modules are used in high end computers and aerospace applications, and are also expected to be used in telecommunications and personal computer applications in the very near future. There is a need for multichip modules of even higher density and shorter interconnections.

U.S. Pat. No. 4,954,480 of Imanaka et al. issued Sep. 4, 1990, discloses a multi-layer superconducting circuit substrate, including insulating layers and interconnection patterns of a superconductive ceramic material located between the insulating layers. The patterns of the superconductive ceramic material are connected via through-holes.

The generally recognized procedure for preparing multilayer interconnect structures consists of the sequential deposition of layers by various physical and chemical deposition techniques. In order to provide good quality high temperature superconducting layers with sufficiently high critical current densities, it is expected that these high temperature superconducting layers and the other layers will have to be grown epitaxially. Sequential epitaxial deposition of multilayers is difficult, particularly in view of additional necessary constraints. For example, the materials must be chosen so that the coefficients of thermal expansion of all the materials are essentially the same and any dielectric materials used must also have the proper dielectric constant and low microwave loss.

This invention provides electrical interconnect structures comprised of high temperature superconducting signal layers having increased density and shorter interconnections. This invention also provides processes for making such structures which do not involve epitaxial deposition of all the layers, and thus do not have the severe constraints described above.

SUMMARY OF THE INVENTION

This invention comprises various electrical interconnect structures comprised of high temperature superconducting signal layer substructures. One category of structures comprises signal layer substructures bonded by dielectric layers to one another and to a substructure containing power and ground planes. In one type of such an interconnect structure, each of the signal layer substructures comprises a high temperature superconducting film grown epitaxially on a single crystal substrate. In a second type of such an interconnect structure, the signal layer substructure comprises at least one high temperature superconducting film grown epitaxially on a single crystal substrate, and at least one high temperature superconducting film grown epitaxially on a dielectric material.

This invention further comprises a second category of electrical interconnect structures comprised of high temperature superconducting signal layer substructures bonded to one another by conducting metal. One type of such an electrical interconnect structure comprises two single crystal substrates, each having a patterned epitaxially grown high temperature superconducting film thereon, wherein said films are mechanically bonded and electrically connected at discreet points by conducting metal. This structure may additionally have channels in the exposed regions of one or both substrates on the side on which the superconducting film is located. The superconducting film can be patterned in any of a variety of ways. A preferred pattern is in parallel lines, and in a preferred structure the positioning of the two substrates is such that the two sets of parallel lines are perpendicular to each other to form a grid array. Each substrate can contain at least one hole containing a conducting material to provide electrical connection to the superconducting film.

A second type of such an electrical interconnect structure comprises the above-described structure upon which an electrically conducting layer has been deposited on one or both substrates on the side of the substrate opposite the superconducting film. A layer of dielectric material and a second electrically conducting layer can be deposited upon the first electrically conducting layer. In this situation, the electrically conducting layers serve as a power plane and a ground plane and the dielectric layer serves as an insulator. Electrically conducting metal vias to the various conducting planes are formed through the outer surfaces of the structure to provide means to electrically connect these planes to chips or integrated circuits.

This invention further comprises a process for producing an electrical interconnect structure of the above-described first category comprising:

(1) forming a substructure A by:
   (a) depositing onto a substrate a first electrically conducting film which can serve as a power plane or ground plane;
   (b) depositing a layer of dielectric material onto the electrically conducting film; and
   (c) depositing a second electrically conducting film which can serve as a ground plane or power plane onto the layer of dielectric material; and (2) forming a substructure B by:
   (a) depositing a high temperature superconducting film onto a first single crystal substrate chosen to provide epitaxial growth for said superconducting film and patterning the superconducting film to form a first patterned signal layer;
   (b) forming metal contact pads onto the first patterned signal layer;

(3) bonding the exposed patterned signal layer of substructure B to the exposed electrically conducting film of substructure A with a dielectric material having a thickness of at least about 2 µm and a dielectric constant of less than about 5;

(4) reducing the thickness of the first single crystal substrate to a maximum thickness of about 25 µm;

(5) forming a substructure C by:

(a) depositing a high temperature superconducting film onto a second single crystal substrate chosen to provide epitaxial growth for the superconducting film and patterning the superconducting film to form a second patterned signal layer;

(b) forming metal contact pads onto the second patterned signal layer;

(6) bonding the exposed patterned signal layer of substructure C to the reduced first single crystal substrate of combined substructures A and B with a dielectric material having a dielectric constant of less than about 5;

(7) producing holes through the top surface (second crystal substrate) of the combined substructures A, B, and C to the ground plane, power plane, and signal layers; and (8) depositing metal into the holes produced in (7) to provide vias to said planes and layers to yield an electrical interconnect structure.

This invention further comprises the electrical interconnect structure prepared by the above process.

This invention further comprises a process for producing an electrical interconnect structure comprising:

(1) forming a substructure D by:

(a) depositing a high temperature superconducting film onto a first single crystal substrate chosen to provide epitaxial growth for the superconducting film and patterning the film to form a first patterned signal layer;

(b) forming metal contact pads onto the first patterned signal layer;

(c) depositing a dielectric material having a dielectric constant of less than about 5 by epitaxial growth onto the first patterned signal layer and any exposed substrate;

(d) depositing a high temperature superconducting film onto the dielectric material by epitaxial growth and patterning the film to form a second patterned signal layer;

(e) forming metal contact pads onto the second patterned signal layer to yield the substructure A;

(2) forming a substructure A by:

(a) depositing onto a substrate, a first electrically conducting film which can serve as a power plane or ground plane;

(b) depositing a layer of dielectric material onto the electrically conducting film;

(c) depositing a second electrically conducting film which can serve as a ground plane or power plane onto the layer of dielectric material;

(3) bonding the exposed patterned signal layer of substructure D to the exposed electrically conducting film of substructure A with a layer of dielectric material having a thickness of at least 2 μm and a dielectric constant of less than about 5; and (4) producing holes through the top surface (reduced first crystal substrate) of the combined substructures D and A to the power plane, ground plane, and signal layers and depositing metal into the holes to provide vias to said planes and layers to yield the electrical interconnect structure.

This invention further comprises an electrical interconnect structure prepared by the above process.

DETAILED DESCRIPTION OF THE INVENTION

Figure 1:
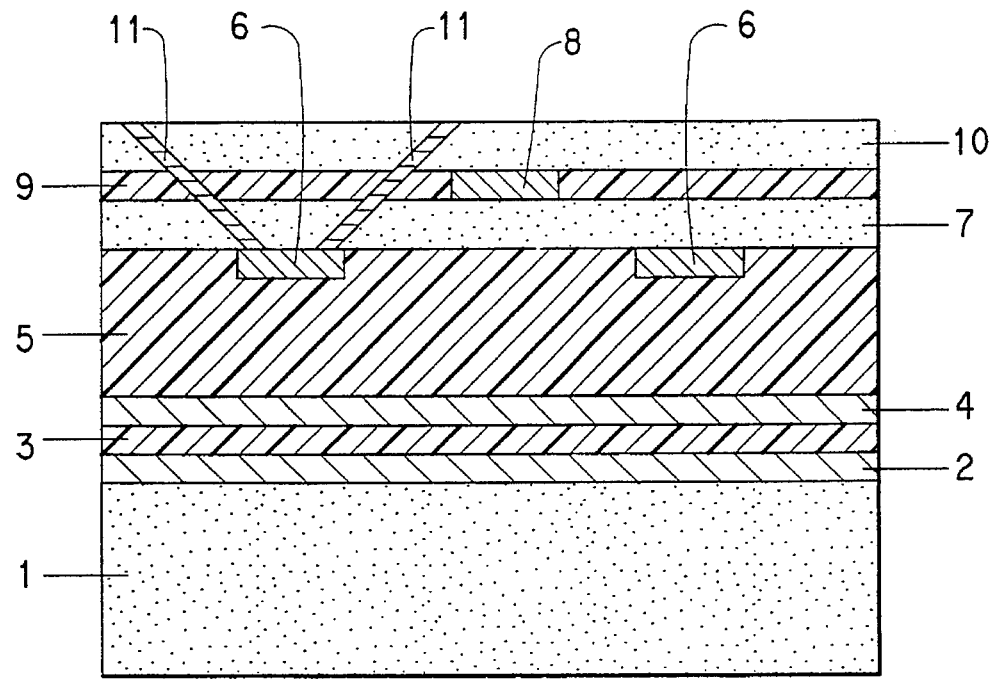
FIG. 1 is a schematic cross-section of an electrical interconnect structure of this invention.

This invention provides electrical interconnect structures comprised of high temperature superconducting signal layers. One category of structures comprises signal layer substructures bonded by dielectric layers to one another and to power and ground planes, and processes for producing it. With the processes of the present invention the properties of the various layers of such a final multilayer structure can be more easily optimized than with the commonly accepted method of epitaxially depositing one layer on top of another. This ability to optimize properties of the individual layers, i.e., to provide good quality high temperature superconducting signal layers and dielectric layers with the proper characteristics results in a superior electrical interconnect structure.

One process for preparing the electrical interconnect structure of this category of the present invention comprises creating signal substructures by depositing each high temperature superconducting film which is to serve as a signal layer onto a single crystal substrate chosen to provide epitaxial growth for the superconducting film. The superconducting film is then patterned to form a patterned signal layer and metal contact pads formed at various positions on the patterned signal layer.

A base substructure is formed by depositing an electrically conducting film onto a substrate. A layer of dielectric material is deposited onto the film and a second electrically conducting film is subsequently deposited onto the layer of dielectric material. One of the films serves as a ground plane and the other as a power plane.

The patterned signal substructures are then bonded to the base substructure with dielectric material having a dielectric constant of less than about 5. The first exposed patterned signal layer is bonded to the exposed electrically conducting film of the base substructure with a dielectric layer. The top surface of this combined structure is the single crystal substrate on which the high temperature superconducting film was deposited and this substrate is then reduced to a maximum thickness of about 25 μm, preferably about 5 μm, most preferably 1 μm or less. The second, and any additional signal substructures are bonded to the combined structure with dielectric material having a dielectric constant of less than about 5 and a thickness of about 1 μm or less. For each substructure the exposed patterned signal layer is bonded to the reduced crystal substrate of the previously added substructure. The substrate supporting the signal layer is reduced in thickness to about 25 μm or less, preferably about 5 μm, and most preferably 1 μm or less following the bonding of substructure to the combined structure but before the bonding of any additional signal layer substructures. Holes are produced through the top surface of the final combined structure to the various ground, power, and signal planes in the combined structure. Metal is deposited into these holes to provide vias to the ground, power, and signal planes and complete the electrical interconnect structure.

The process for producing this type of electrical interconnect structure comprises making a substructure A comprising a substrate 1 in FIG. 1, an electrically conducting layer 2 which serves as either a power or ground plane, a layer of dielectric material 3 and an electrically conducting layer 4 which serves as either a power or ground plane. A substructure B is then formed by depositing and patterning a superconducting signal layer 6 onto a signal crystal substrate 7 followed by formation of metal contact pads onto patterned signal layer 6. A substructure C is formed by depositing and patterning a superconducting layer 8 onto a second single crystal substrate 10 followed by formation of metal contact pads onto patterned signal layer 8. Substructure B is bonded to substructure A by bonding patterned signal layer 6 of B to electrically conducting layer 4 of A using dielectric material 5. The thickness of the crystal substrate 7 is then reduced to less than about 25 µm. Substructure C is then bonded to combined substructures A and B by bonding patterned signal layer 8 of C to reduced crystal substrate 7 of A+B using dielectric material 9. The thickness of crystal substrate 10 is then optionally reduced to a maximum of about 5 µm. Holes are then produced from crystal substrate 10 into the combined substructures A+B+C to the various planes and signal layers and metal deposited within to provide vias. One such vias is depicted as 11.

The electrically conducting layers can be metals such as gold, silver or copper or high temperature oxide superconductors. Superconductors suitable for use in any of the structures of the present invention as electrically conducting layers or signal layers include $MBa_2Cu_3O_x$ wherein x is from about 6.7 to about 7.0 and M is Y, Nd, Sm, Eu, Gd, Dy, Ho, Er, Tm, Yb, or Lu; oxides in the Bi—Sr—Ca—Cu—O system such as $Bi_2Sr_{3-z}Ca_zCu_2O_8$ wherein z is from about 0.4 to about 0.8; oxides in the Tl—Ba—Ca—Cu—O system such as $Tl_2Ba_2CuO_6$, $Tl_2Ba_2CaCu_2O_8$ and $Tl_2Ba_2Ca_2Cu_3O_{10}$; and the Tl—Pb oxides $Tl_{0.5}Pb_{0.5}Sr_2CaCu_2O_7$, $Tl_{0.5}Pb_{0.5}Sr_2Ca_2Cu_3O_9$ and $Tl_{0.5}Pb_{0.5}Sr_2Ca_3Cu_4O_{11}$, preferably with superconducting transition temperatures of 90° K. or above.

When the electrically conducting layers of substructure A are the oxide superconductors, these layers and the dielectric layer are grown epitaxially in order to produce good quality superconducting layers with sufficiently high critical current density. A single crystal substrate is used and the material must be suitable for the epitaxial growth of the oxide. Substrates used for epitaxial growth of the high temperature superconductors are $LaAlO_3$, MgO, sapphire, $NdGaO_3$ and yttrium stabilized zirconia. Prior deposition of a 30 to 50 nm layer of epitaxial cerium oxide, magnesium oxide, or a rare earth oxide serves as a buffer layer between the substrate and the superconducting film to help enhance epitaxial growth. The term "single crystal substrate" as used herein includes single crystal substrates with or without a buffer layer.

The oxide films and the dielectric material can be deposited by any of the known mechanisms for depositing such films, such as by magnetron sputtering or laser ablation sputtering. The thicknesses of the oxide power plane layer and the oxide ground plane are not critical but are typically about 1 µm. The dielectric material 3 between the ground and power planes preferably has a dielectric constant of at least about 5, more preferably at least about 10, and a typical thickness of from about 10 nm to about 10 microns, typically about 1 µm. It should be suitable for growing epitaxially on the superconducting oxide layer 2 and also be suitable for the epitaxial growth of the oxide layer 4. The substrate material, the oxide superconductor and the dielectric all have essentially the same coefficients of thermal expansion. Examples of suitable dielectric materials are barium titanate, strontium titanate, lanthanum aluminate, or other perovskites.

In order to provide a low resistance contact to the oxide superconductor layers comprising the ground and power planes for the metal vias which are subsequently produced, metal contact pads are formed on the oxide superconductors before the substructure A is bonded to a signal layer. Metals such as silver and gold are especially useful for forming the contact pads. The metal can be deposited directly on the surface of oxide layer 4. Holes are produced through the oxide layer 4 and the dielectric layer 3 to the oxide layer 2 by ion beam milling, laser ablation or chemical etching. A metal is then deposited onto the oxide layer 2 and annealed by heating the substructure A to a temperature of about 500° C. and maintaining at this temperature for 10–15 minutes and then cooling to ambient temperature. The heating and cooling is carried out in an oxygen atmosphere. When the electrically conducting layers of substructure A are metals, no additional metal contact pads are required.

When the electrically conducting layers of substructure A are metals the restrictions on the substrate material and the dielectric material are relaxed considerably although the dielectric material preferably has a dielectric constant of at least about 5, more preferably at least about 10. The substrate does not have to be a single crystal and suitable substrates include ceramics, glasses, or any nonconducting material. The dielectric material can be a polymer or a noncrystalline inorganic composition. The thickness of the ground plane and power plane are not critical but are typically about 1 µm.

Substructures B and C, or additional substructures comprise superconducting thin film signal layers. Each high temperature superconducting thin film signal layer is prepared by depositing a high temperature superconductor thin film epitaxially on a single crystal substrate. The superconducting film must have a thickness sufficient to carry current, preferably from about 0.2 µm to about 2 µm. Suitable substrates include $LaAlO_3$, MgO, $NdGaO_3$, and sapphire. Prior deposition of a 30 to 50 nm layer of epitaxial cerium oxide, magnesium oxide, or a rare earth oxide serves as a buffer layer between the substrate and the superconducting film to help enhance epitaxial growth. The term "single crystal substrate" as used herein includes single crystal substrates with or without a buffer layer. Again the oxide film can be deposited by any of the known mechanisms for depositing such films such as by magnetron sputtering or laser ablation sputtering. The oxide superconducting film is then patterned to provide the desired signal layer configuration of superconductor. Photolithographic techniques coupled with wet chemical etching or reactive ion beam etching can be employed. In order to provide a low resistance contact to the superconductor signal layer for the metal vias which are subsequently produced, metal contact pads are formed on the oxide superconductor before the signal layer is bonded to the base substructure A or to another signal layer substructure. A metal such as silver or gold can be deposited directly on the surface of the patterned signal layer. The signal layer is then heated to a temperature of about 500° C. and maintained at this temperature for 10–15 minutes and then cooled to ambient temperature. The heating and cooling is carried out in an oxygen atmosphere.

A signal layer substructure is bonded to the substructure A by a layer of dielectric material 5. The layer is from about 2 µm to about 4 µm thick and the dielectric constant is less than 5, preferably less than 4. A polymer is preferred and a fluoropolymer or a polyimide is especially preferred. These polymers have low dielectric constants, in the range of about 2–3, and provide mechanical compliance to adjust to any mismatch in coefficients of thermal expansion between layers of the electrical interconnect structure.

The exposed patterned signal layer of substructure B is bonded to the exposed electrically conducting film of substructure A. The dielectric material 5 is spread onto one of the above substructure surfaces and the other substructure placed in contact with the dielectric material which is typically tacky. The curing of the dielectric material laminates the two substructures together. The thickness of the first single crystal substrate which is now the top surface of combined substructures A and B is reduced in thickness to a maximum of about 25 µm, preferably to about 5 µm, most preferably to about 1 µm by mechanically lapping and/or polishing, chemically assisted lapping and/or polishing, chemical etching or ion etching.

A substructure C comprising a second single crystal substrate 10 with a patterned signal layer 8 and metal contact pads is bonded to the single crystal 7 which was reduced in thickness, that is, to the top surface of the combined structure A and B by a layer of dielectric material 9. Dielectrics described above for the previous bonding step can be used. The thickness of dielectric layer 9 is typically about 1 µm.

The top surface of the newly combined structure (A+B+C) formed by the bonding and containing two signal planes is the second single crystal substrate. Optionally, this substrate is now reduced in thickness a maximum of about 25 µm, preferably to about 5 µm, most preferably to about 1 µm or less by mechanically lapping and/or polishing, chemically assisted lapping and/or polishing, chemical etching or ion etching. Alternatively the single crystal substrate can be left at its original thickness. No additional passivation layer is needed; this single crystal substrate serves the purpose.

Additional signal layers, power planes, and ground planes can be added to the structure by repeating the above-described bonding process followed by the reduction in substrate thickness.

Holes are produced through the top surface of the combined structure and any intervening layers to the power plane, the ground plane, and the signal layers by ion beam milling, laser ablation, or chemical etching. Holes to the signal layers and to an oxide superconductor power plane and ground plane are positioned to coincide with the contact pads that were formed on the oxide superconductors. A metal such as gold or silver is then deposited in these holes using ion beam assisted deposition to form the connecting vias to these planes and signal layers.

Figure 2:
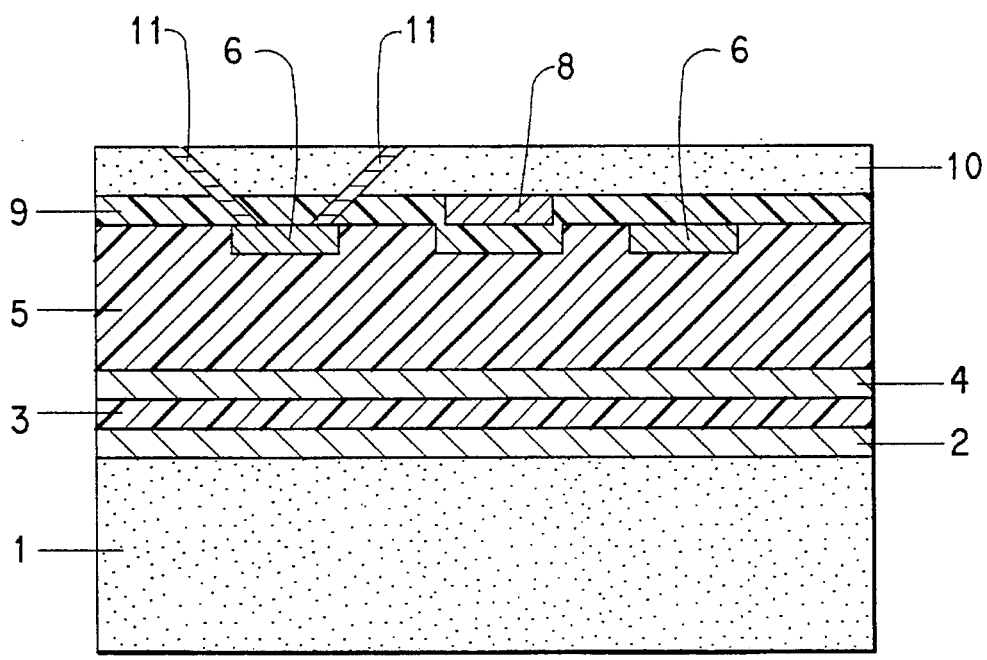
FIG. 2 is a schematic cross-section of an electrical interconnect structure of this invention.

A second process for producing the electrical interconnect structure of the present invention involves creating two substructures, bonding them together, and generating the connecting vias to the various planes. The numbers in the following description refer to FIG. 2.

In this process a substructure D is prepared by depositing a high temperature superconducting film to serve as a signal layer 8 onto a single crystal substrate 10 chosen to provide epitaxial growth for the superconducting film. The superconducting film is then patterned. Suitable substrates, superconductors, and deposition and patterning techniques are as previously described for forming substructures B and C in the prior process.

Metal contact pads are then formed on the patterned signal layer, also as previously described. A dielectric material 9 having a dielectric constant less than about 5 is deposited by epitaxial growth onto the patterned signal layer 8 and any exposed substrate 10. The surface of dielectric material 9 is not planar but substantially follows the pattern of signal layer 8. Its thickness is typically about 1 µm or less. A high temperature superconducting thin film is then deposited on the dielectric material 9 by epitaxial growth, and the film patterned to form a second patterned signal layer 6. Metal contact pads are formed on the second patterned signal layer. This completes substructure D.

A substructure A is formed in the same manner and using the same types of materials as previously described. An electrically conducting film which can serve either as a power plane or ground plane 2 is deposited onto a substrate 1. Metal contact pads are formed on the electrically conducting film if said film is a superconductor. A layer of dielectric material 3 preferably having a dielectric constant of at least about 5, more preferably at least about 10, is deposited onto the ground or power plane 2. A second electrically conducting film which can serve as a ground plane or power plane 4 is deposited onto the dielectric material 3 to complete substructure A. One of the electrically conducting films serves as a power plane and the other as a ground plane.

The exposed patterned signal layer 6 of substructure D is then bonded to the exposed electrically conducting film 4 of substructure A with a layer of dielectric material 5 having a thickness of 2 to 4 µm and a dielectric constant of less than about 5. The thickness of the single crystal substrate 10 (originally a part of substructure D) is optionally reduced to a maximum thickness of about 5 µm, preferably to about 1 µm by mechanically lapping and/or polishing, chemically assisted lapping and/or polishing, chemical etching or ion etching.

Holes are then produced through the top surface of the combined structure and any intervening layers to the power plane, ground plane, and signal layers by ion beam milling, laser ablation, or chemical etching. The holes are positioned to coincide with the metal contact pads previously formed on the signal layers and on any power or ground planes comprised of a superconductor. If the power or ground planes are metal, holes to any point on their surfaces are sufficient. A metal such as gold or silver is often deposited in the hole using ion beam assisted deposition to form connecting vias such as 11 to the plane and signal layers.

Figure 3:
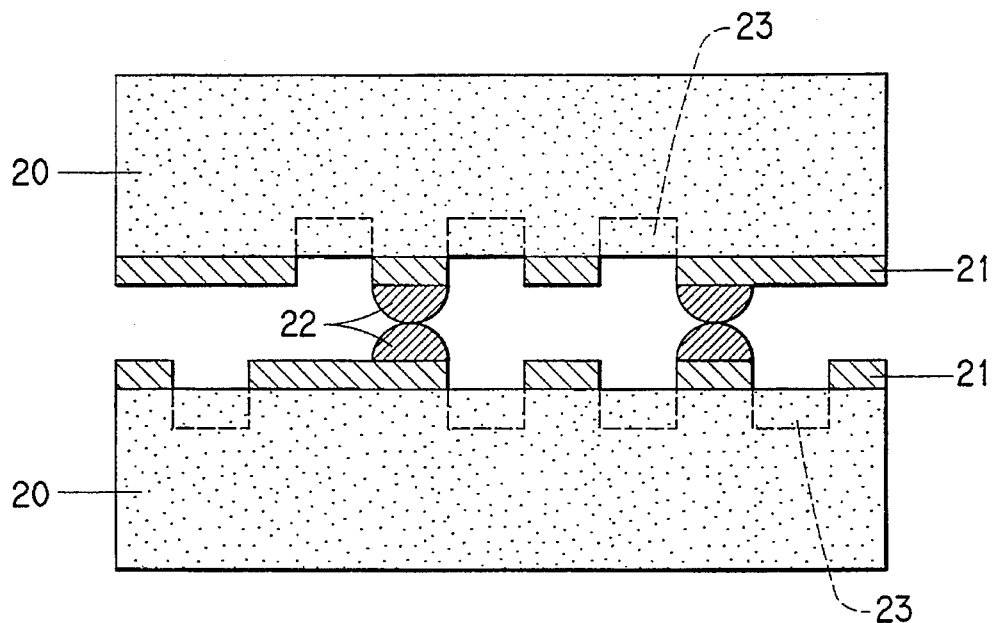
FIG. 3 is a schematic cross-section of an electrical interconnect structure of this invention.

This invention provides a second category of electrical interconnect structures comprising high temperature superconducting signal layer substructures bonded to one another by conducting metal. One type of such a structure is depicted in FIG. 3 and comprises two substructures C prepared as previously described and using suitable materials as previously described, each comprising a single crystal substrate 20, having deposited epitaxially thereon a superconducting film which is patterned to form a patterned signal layer 21. After patterning the superconducting film, channels 23 can optionally be etching in the exposed substrate by ion beam milling or other methods known to those skilled in the art. Conducting metal is deposited onto the patterned signal layer at discrete points 22 at desired locations. One substructure C is bonded to a second substructure C by aligning the points of conducting metal to contact each other, followed by fusing the two metals using heat and/or pressure.

The superconducting film can be patterned in any of a variety of ways as previously described. A preferred configuration is a pattern of parallel lines to enable formation of a grid array by positioning two substructures C so that the parallel lines of each are perpendicular to each other.

After bonding of the two substructures C, a conducting means is attached between the patterned signal layer and an integrated circuit or chip. Alternatively, holes can be produced through the outer surface of the substrate to the pattern signal layers by ion beam milling, laser ablation or chemical etching. Conducting metal such as gold or silver is deposited in the holes to form conducting vias to these layers.

Figure 4:
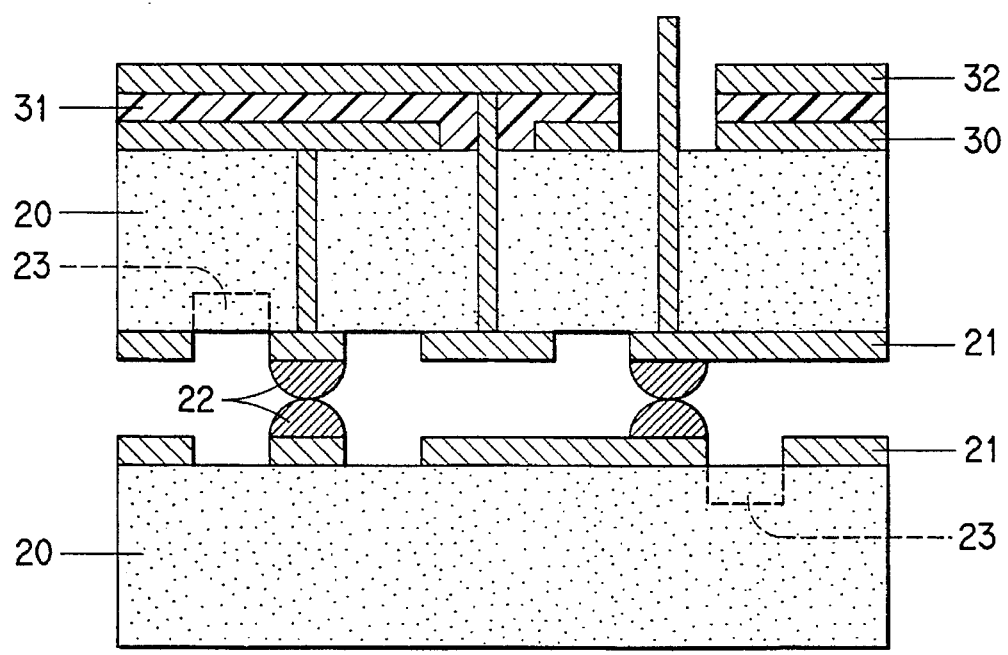
FIG. 4 is a schematic cross-section of an electrical interconnect structure of this invention.

A second type of such an electrical interconnect structure is depicted in FIG. 4 and comprises two bonded substructures C having the same elements 20, 21, 22 and optionally 23 as described in FIG. 3 upon which an electrically conducting layer 30 has been deposited on one or both substrates 20. Suitable materials for the electrically conducting layer are as previously described for substructure A. Optionally, a layer dielectric material 31 and a second electrically conducting layer 32 can be deposited upon the first electrically conducting layer 30. The dielectric material preferably has a dielectric constant and thickness as described for substructure A. Electrically conducting layers 30 and 32 can be patterned if desired. Connections to integrated circuits or chips can be made via conducting means or vias as previously described. Additionally a via can be created as previously described to provide electrical connection between the patterned signal layer and one or more of the electrically conducting layers.

For all of the types of electrical interconnect structures which employ metallic bonding any void spaces between the two substrates (substructures C) can be filled with a suitable dielectric material. This is done prior to bonding of the two substructures C by spinning on a layer or coating of a suitable polymer, preferably a fluoropolymer or polyimide, followed by etching away the polymer at the conducting metal points or bumps. The two substructures are then bonded as previously described.

One advantage of the present invention is that multiple chips can be mounted on both outer substrate surfaces to provide increased density and shorter interconnections. Use of high temperature superconductors permits a decrease in line cross section while retaining good signal quality thereby allowing an increased density of interconnections. The interconnect structures of the present invention are useful in multichip modules for computers and telecommunications.

The following abbreviations are used in the Examples:

HTS—high temperature superconductor
PMMA—polymethylmethacrylate
UV—ultraviolet

EXAMPLE 1

In order to demonstrate some critical features of the interconnect system, a test structure was fabricated in the following manner.

A 30–50 nm layer of epitaxial cerium oxide was deposited by magnetron sputtering onto one surface of each of two 1.2 cm×1.2 cm×0.05 cm single crystal sapphire substrates. Epitaxial high temperature superconducting thin films of $YBa_2Cu_3O_x$ were deposited onto each of the cerium oxide layers by magnetron sputtering. A layer of amorphous fluoropolymer (TEFLON® AF2400) approximately 4 μm thick was spun onto the superconducting thin film surface of one substrate and the other substrate placed on top of the fluoropolymer such that the two superconducting thin films faced each other with the polymer film between them. The two sapphire substrates formed the outer surfaces of the structure. The fluoropolymer was cured for one hour at 170° C. to yield a bonded structure having a dielectric layer of dielectric constant 1.91 with a radio frequency loss tangent of less than $3 \times 10^{-4}$.

To demonstrate reducing the thickness of a substrate, one of the sapphire substrates of the structure made above was waxed to a glass carrier that served as the support during the polishing operation. This polishing step was carried out in a Logitech polishing system by autocollimating with visible light on the back surface of the superconducting thin film on the substrate that was waxed to the glass. Initial polishing used micron size diamond grit for rapid material removal. The final polishing was accomplished by polishing with submicron diamond grit to achieve the desired thickness. The thickness of the substrate was polished from a thickness of 0.05 cm to a thickness of less than 0.0002 cm (2 μm).

Testing, using a radio frequency inductance technique [LakeShore (DRC91C)], showed that the critical temperature of neither superconducting thin film was affected by the fabrication processes. The final structure demonstrated 1) the ability to provide a very low dielectric material which bonds two epitaxial high temperature superconducting thin films without degradation of properties, 2) the ability to reduce the thickness of a substrate to the required thickness (approximately 1 μm), and 3) that a polymer of relatively high linear coefficient of thermal expansion (CTE) (approximately 80 ppm/°C.) has sufficient compliance to accommodate the large CTE mismatch with substrates and thin films (approximately 10 ppm/°C.) over the temperature range of interest.

EXAMPLE 2

A structure can be fabricated in the following manner.

Epitaxial high temperature superconducting thin films of $YBa_2Cu_3O_7$ are deposited on two single crystal lanthanum aluminate substrates. The depositions are done using off axis magnetron sputtering with the substrate heated to between 600° and 800° C. The final film thicknesses are between 0.1 and 1 micron.

The films are patterned by a standard bi-level photolithography process followed using ion beam etching. A photoresist etch mask is used to define the pattern on the HTS films. The bilevel photolith process utilized begins with coating the HTS films with KTI 496K molecular weight standard PMMA at 9% solids. The thickness should be approximately 1.2 microns. The PMMA is cured at 170° C. for 30 minutes. The PMMA is then coated with Shipley 1400-17 positive photoresist to a thickness of 0.5 micron. The resist is cured in air at 90° C. for 25 minutes. The 1400-17 is exposed to UV light in the range of 100 mJ per square centimeter. The 1400-17 is immersed in a 2:1 combination of Shipley MF312 developer to deionized water for 60 s. The photoresist is exposed to a low power oxygen plasma and descumed. The PMMA in open areas where the 1400-17 resist has been removed is exposed by flood exposure of collimated deep UV source with 10 J per square centimeter in the 220–260 nm range. The exposed PMMA is developed using toluene for 4 minute.

The now exposed HTS film is etched by argon ion beam milling. The remaining photoresist and PMMA are removed by solvents or oxygen plasma.

Conducting metal bump bonds of gold are photolithographically defined utilizing exactly the process described above and are deposited on the HTS film using DC or RF sputtering. The substrates with the defined metal bumps are annealed at 510° C. for 1 hour to ensure low metal to HTS contact resistance. The metal bumps are now pre-tinned with 80:20 AuSn alloy solder.

The two substrates with defined HTS films are registered such that the metal bumps with solder are aligned and placed in physical contact. The aligned substrates are then heated to 300° C. in air to flow the solder and bond the aligned metal bumps.

EXAMPLE 3

A structure can be fabricated in the following manner.

Epitaxial high temperature superconducting thin films of $YBa_2Cu_3O_7$ are deposited on two single crystal lanthanum aluminate substrates. The depositions are done using off axis magnetron sputtering with the substrate heated to between 600° and 800° C. The final film thicknesses are between 0.1 and 1 micron.

The films are patterned by a standard bi-level photolithography process followed using ion beam etching. A photoresist etch mask is used to define the pattern on the HTS films. The bilevel photolith process utilized begins with coating the HTS films with KTI 496K molecular weight standard PMMA at 9% solids. The thickness should be approximately 1.2 microns. The PMMA is cured at 170° C. for 30 minutes. The PMMA is then coated with Shipley 1400-17 positive photoresist to a thickness of 0.5 micron. The resist is cured in air at 90° C. for 25 minutes. The 1400-17 is exposed to UV light in the range of 100 mJ per square centimeter. The 1400-17 is immersed in a 2:1 combination of Shipley MF312 developer to deionized water for 60 s. The photoresist is exposed to a low power oxygen plasma and descumed. The PMMA in open areas where the 1400-17 resist has been removed is exposed by flood exposure of collimated deep UV source with 10 J per square centimeter in the 220–260 nm range. The exposed PMMA is developed using toluene for 4 minute.

The now exposed HTS film is etched by argon ion beam milling. In order to etch the channels in the substrate, the now exposed areas of the substrate are etched by continuing the ion beam milling process with the substrate etched at the rate of 10 nm/min. The remaining photoresist and PMMA are removed by solvents or oxygen plasma.

Conducting metal bump bonds of gold are photolithographically defined utilizing exactly the process described above and are deposited on the HTS film using DC or RF sputtering. The substrates with the defined metal bumps are annealed at 510° C. for 1 hour to ensure low metal to HTS contact resistance. The metal bumps are now pre-tinned with 80:20 AuSn alloy solder.

The two substrates with defined HTS films are registered such that the metal bumps with solder are aligned and placed in physical contact. The aligned substrates are then heated to 300° C. in air to flow the solder and bond the aligned metal bumps.

EXAMPLE 4

A structure can be fabricated in the following manner.

Epitaxial high temperature superconducting thin films of $YBa_2Cu_3O_7$ are deposited on two single crystal lanthanum aluminate substrates. The depositions are done using off axis magnetron sputtering with the substrate heated to between 600° and 800° C. The final film thicknesses are between 0.1 and 1 micron.

The films are patterned by a standard bi-level photolithography process using ion beam etching. A photoresist etch mask of parallel lines is used to define the grid pattern on the HTS films. The bilevel photolith process utilized begins with coating the HTS films with KTI 496K molecular weight standard PMMA at 9% solids. The thickness should be approximately 1.2 microns. The PMMA is cured at 170° C. for 30 minutes. The PMMA is then coated with Shipley 1400-17 positive photoresist to a thickness of 0.5 micron. The resist is cured in air at 90° C. for 25 minutes. The 1400-17 is exposed to UV light in the range of 100 mJ per square centimeter. The 1400-17 is immersed in a 2:1 combination of Shipley MF312 developer to deionized water for 60 s. The photoresist is exposed to a low power oxygen plasma and descumed. The PMMA in open areas where the 1400-17 resist has been removed is exposed using a collimated deep UV source with 10 J per square centimeter in the 220–260 nm range. The exposed PMMA is developed using toluene for 4 minutes.

The now exposed HTS film is etched by argon ion beam milling. In order to etch the channels in the substrate, the now exposed areas of the substrate are etched by continuing the ion beam milling process with the substrate etched at the rate of 10 nm/min. The remaining photoresist and PMMA are removed by solvents or oxygen plasma.

Conducting metal bump bonds of gold are photolithographically defined utilizing exactly the process described above and are deposited on the HTS film using DC or RF sputtering. The substrates with the defined metal bumps are annealed at 510° C. for 1 hour to ensure low metal to HTS contact resistance. The metal bumps are now pre-tinned with 80:20 AuSn alloy solder.

The two substrates with defined HTS films are registered such that the metal bumps with solder are aligned and placed in physical contact. The aligned substrates are then heated to 300° C. in air to flow the solder and bond the aligned metal bumps.

EXAMPLE 5

A structure can be fabricated in the following manner.

Epitaxial high temperature superconducting thin films of $YBa_2Cu_3O_7$ are deposited on two single crystal lanthanum aluminate substrates. The depositions are done using off axis magnetron sputtering with the substrate heated to between 600° and 800° C. The final film thicknesses are between 0.1 and 1 micron.

The films are patterned by a standard bi-level photolithography process using ion beam etching. A photoresist etch mask of parallel lines is used to define the grid pattern on the HTS films. The bilevel photolith process utilized begins with coating the HTS films with KTI 496K molecular weight standard PMMA at 9% solids. The thickness should be approximately 1.2 microns. The PMMA is cured at 170° C. for 30 minutes. The PMMA is then coated with Shipley 1400-17 positive photoresist to a thickness of 0.5 micron. The resist is cured in air at 90° C. for 25 minutes. The 1400-17 is exposed to UV light in the range of 100 mJ per square centimeter. The 1400-17 is immersed in a 2:1 combination of Shipley MF312 developer to deionized water for 60 s. The photoresist is exposed to a low power oxygen plasma and descumed. The PMMA in open areas where the 1400-17 resist has been removed is exposed using a collimated deep UV source with 10 J per square centimeter in the 220–260 nm range. The exposed PMMA is developed using toluene for 4 minutes.

The now exposed HTS film is etched by argon ion beam milling. In order to etch the channels in the substrate, the now exposed areas of the substrate are etched by continuing the ion beam milling process with the substrate etched at the rate of 10 nm/min. The remaining photoresist and PMMA are removed by solvents or oxygen plasma.

Conducting metal bump bonds of gold are photolithographically defined utilizing exactly the process described above and are deposited on the HTS film using DC or RF sputtering. The substrates with the defined metal bumps are annealed at 510° C. for 1 hour to ensure low metal to HTS contact resistance. The metal bumps are now pre-tinned with 80:20 AuSn alloy solder.

Electrical connection to the patterned superconducting film can be made through the substrate by eximer laser drilling a hole through the substrate to the HTS film. The hole can then be coated with a conducting film of DC or RF sputtered gold metal to make electrical contact to the superconducting film.

The two substrates with defined HTS films are registered such that the metal bumps with solder are aligned and placed in physical contact. The aligned substrates are then heated to 300° C. in air to flow the solder and bond the aligned metal bumps.

EXAMPLE 6

A structure can be fabricated in the following manner.

Epitaxial high temperature superconducting thin films of $YBa_2Cu_3O_7$ are deposited on two single crystal lanthanum aluminate substrates. The depositions are done using off axis magnetron sputtering with the substrate heated to between 600° and 800° C. The final film thicknesses are between 0.1 and 1 micron.

The films are patterned by a standard bi-level photolithography process using ion beam etching. A photoresist etch mask is used to define the pattern on the HTS films. The bilevel photolith process utilized begins with coating the HTS films with KTI 496K molecular weight standard PMMA at 9% solids. The thickness should be approximately 1.2 microns. The PMMA is cured at 170° C. for 30 minutes. The PMMA is then coated with Shipley 1400-17 positive photoresist to a thickness of 0.5 micron. The resist is cured in air at 90° C. for 25 minutes. The 1400-17 is exposed to UV light in the range of 100 mJ per square centimeter. The 1400-17 is immersed in a 2:1 combination of Shipley MF312 developer to deionized water for 60 s. The photoresist is exposed to a low power oxygen plasma and descumed. The PMMA in open areas where the 1400-17 resist has been removed is exposed using a collimated deep UV source with 10 J per square centimeter in the 220–260 nm range. The exposed PMMA is developed using toluene for 4 minutes.

The now exposed HTS film is etched by argon ion beam milling. The remaining photoresist and PMMA are removed by solvnets or oxygen plasma.

Conducting metal bump bonds of gold are photolithographically defined utilizing exactly the process described above and are deposited on the HTS film using DC or RF sputtering. The substrates with the defined metal bumps are annealed at 510° C. for 1 hour to ensure low metal to HTS contact resistance. The metal bumps are now pre-tinned with 80:20 AuSn alloy solder.

The sides of the substrates not having the patterned HTS film can be utilized for additional electrical purposes such as providing power, ground, and possibly other signal lines by depositing alternating layers of conducting material such as gold and insulator material such as strontium titanate. The gold can be deposited by DC or RF sputtering and the strontium titanate would be deposited by RF sputtering. These layers can be patterned by utilizing exactly the same patterning process as described above.

The two substrates with defined HTS films are registered such that the metal bumps with solder are aligned and placed in physical contact. The aligned substrates are then heated to 300° C. in air to flow the solder and bond the aligned metal bumps.

EXAMPLE 7

A structure can be fabricated in the following manner.

Epitaxial high temperature superconducting thin films of $YBa_2Cu_3O_7$ are deposited on two single crystal lanthanum aluminate substrates. The depositions are done using off axis magnetron sputtering with the substrate heated to between 600° and 800° C. The final film thicknesses are between 0.1 and 1 micron.

The films are patterned by a standard bi-level photolithography process using ion beam etching. A photoresist etch mask is used to define the pattern on the HTS films. The bilevel photolith process utilized begins with coating the HTS films with KTI 496K molecular weight standard PMMA at 9% solids. The thickness should be approximately 1.2 microns. The PMMA is cured at 170° C. for 30 minutes. The PMMA is then coated with Shipley 1400-17 positive photoresist to a thickness of 0.5 micron. The resist is cured in air at 90° C. for 25 minutes. The 1400-17 is exposed to UV light in the range of 100 mJ per square centimeter. The 1400-17 is immersed in a 2:1 combination of Shipley MF312 developer to deionized water for 60 s. The photoresist is exposed to a low power oxygen plasma and descumed. The PMMA in open areas where the 1400-17 resist has been removed is exposed by flood exposure using a deep UV source with 10 J per square centimeter in the 220–260 nm range. The exposed PMMA is developed using toluene for 4 minutes.

The now exposed HTS film is etched by argon ion beam milling. In order to etch the channels in the substrate, the now exposed areas of the substrate are etched by continuing the ion beam milling process with the substrate etched at the rate of 10 nm/min. The remaining photoresist and PMMA are removed by solvents or oxygen plasma.

Conducting metal bump bonds of gold are photolithographically defined utilizing exactly the process described above and are deposited on the HTS film using DC or RF sputtering. The substrates with the defined metal bumps are annealed at 510° C. for 1 hour to ensure low metal to HTS contact resistance. The metal bumps are now pre-tinned with 80:20 AuSn alloy solder.

The sides of the substrates not having the patterned HTS film can be utilized for additional electrical purposes such as providing power, ground, and possibly other signal lines by depositing alternating layers of conducing material such as gold and insulator material such as strontium titanate. The gold can be deposited by DC or RF sputtering and the strontium titanate would be deposited by RF sputtering. These layers can be patterned by utilizing exactly the same patterning process as described above.

The two substrates with defined HTS films are registered such that the metal bumps with solder are aligned and placed in physical contact. The aligned substrates are then heated to 300° C. in air to flow the solder and bond the aligned metal bumps.

EXAMPLE 8

A structure can be fabricated in the following manner.

Epitaxial high temperature superconducting thin films of YBa$_2$Cu$_3$O$_7$ are deposited on two single crystal lanthanum aluminate substrates. The depositions are done using off axis magnetron sputtering with the substrate heated to between 600° and 800° C. The final film thicknesses are between 0.1 and 1 micron.

The films are patterned by a standard bi-level photolithography process using ion beam etching. A photoresist etch mask of parallel lines is used to define the grid pattern on the HTS films. The bilevel photolith process utilized begins with coating the HTS films with KTI 496K molecular weight standard PMMA at 9% solids. The thickness should be approximately 1.2 microns. The PMMA is cured at 170° C. for 30 minutes. The PMMA is then coated with Shipley 1400-17 positive photoresist to a thickness of 0.5 micron. The resist is cured in air at 90° C. for 25 minutes. The 1400-17 is exposed to UV light in the range of 100 mJ per square centimeter. The 1400-17 is immersed in a 2:1 combination of Shipley MF312 developer to deionized water for 60 s. The photoresist is exposed to a low power oxygen plasma and descumed. The PMMA in open areas where the 1400-17 resist has been removed is exposed using a collimated deep UV source with 10 J per square centimeter in the 220–260 nm range. The exposed PMMA is developed using toluene for 4 minutes.

The now exposed HTS film is etched by argon ion beam milling. In order to etch the channels in the substrate, the now exposed areas of the substrate are etched by continuing the ion beam milling process with the substrate etched at the rate of 10 nm/min. The remaining photoresist and PMMA are removed by solvents or oxygen plasma.

Conducting metal bump bonds of gold are photolithographically defined utilizing exactly the process described above and are deposited on the HTS film using DC or RF sputtering. The substrates with the defined metal bumps are annealed at 510° C. for 1 hour to ensure low metal to HTS contact resistance. The metal bumps are now pre-tinned with 80:20 AuSn alloy solder.

The sides of the substrates not having the patterned HTS film can be utilized for additional electrical purposes such as providing power, ground, and possibly other signal lines by depositing alternating layers of conducing material such as gold and insulator material such as strontium titanate. The gold can be deposited by DC or RF sputtering and the strontium titanate would be deposited by RF sputtering. These layers can be patterned by utilizing exactly the same patterning process as described above.

The two substrates with defined HTS films are registered such that the metal bumps with solder are aligned and placed in physical contact. The aligned substrates are then heated to 300° C. in air to flow the solder and bond the aligned metal bumps.

EXAMPLE 9

A structure can be fabricated in the following manner.

Epitaxial high temperature superconducting thin films of YBa$_2$Cu$_3$O$_7$ are deposited on two single crystal lanthanum aluminate substrates. The depositions are done using off axis magnetron sputtering with the substrate heated to between 600° and 800° C. The final film thicknesses are between 0.1 and 1 micron.

The films are patterned by a standard bi-level photolithography process using ion beam etching. A photoresist etch mask is used to define the pattern on the HTS films. The bilevel photolith process utilized begins with coating the HTS films with KTI 496K molecular weight standard PMMA at 9% solids. The thickness should be approximately 1.2 microns. The PMMA is cured at 170° C. for 30 minutes. The PMMA is then coated with Shipley 1400-17 positive photoresist to a thickness of 0.5 micron. The resist is cured in air at 90!C for 25 minutes. The 1400-17 is exposed to UV light in the range of 100 mJ per square centimeter. The 1400-17 is immersed in a 2:1 combination of Shipley MF312 developer to deionized water for 60 s. The photoresist is exposed to a low power oxygen plasma and descumed. The PMMA in open areas where the 1400-17 resist has been removed is exposed by flood exposure using a deep UV source with 10 J per square centimeter in the 220–260 nm range. The exposed PMMA is developed using toluene for 4 minutes.

The now exposed HTS film is etched by argon ion beam milling. In order to etch the channels in the substrate, the now exposed areas of the substrate are etched by continuing the ion beam milling process with the substrate etched at the rate of 10 nm/min. The remaining photoresist and PMMA are removed by solvents or oxygen plasma.

Conducting metal bump bonds of gold are photolithographically defined utilizing exactly the process described above and are deposited on the HTS film using DC or RF sputtering. The substrates with the defined metal bumps are annealed at 510° C. for 1 hour to ensure low metal to HTS contact resistance. The metal bumps are now pre-tinned with 80:20 AuSn alloy solder.

The sides of the substrates not having the patterned HTS film can be utilized for additional electrical purposes such as providing power, ground, and possibly other signal lines by depositing alternating layers of conducing material such as gold and insulator material such as strontium titanate. The gold can be deposited by DC or RF sputtering and the strontium titanate would be deposited by RF sputtering. These layers can be patterned by utilizing exactly the same patterning process as described above.

Any one of the conducting layers on the opposite side of the wafer from the patterned HTS film can be electrically connected to the patterned HTS film by producing conducting vias through the substrate. In the case where electrical contact to the layer closest to the substrate is desired, an opening would be formed in all of the layers on top of the bottom layer. The opening would be formed by photolithography and ion beam etching as described above and the size of the opening would be larger than the expected size of the via hole through the substrate. Next the via hole would be formed by excimer laser drilling through the bottom layer and the substrate to the patterned HTS film on the opposite side. The hole can then be coated with a conducting film of DC or RF sputtered gold metal to make electrical contact between the superconducting film and the conducting layer on the opposite side.

Electrical contacts to the patterned HTS film which are insulated from all of the conducting layers on the opposite side of the substrate from the patterned HTS films can also be provided. These contacts are produced by first forming an opening in all of the layers on the side of the substrate opposite from the patterned HTS film. The opening would be formed by photolithography and ion beam etching as described above and the size of the opening would be larger than the expected size of the via hole through the substrate. Next the via hole would be formed by excimer laser drilling through the substrate to the patterned HTS film on the opposite side. The hole can then be coated with a conducting film of DC or RF sputtered gold metal to make electrical contact between the patterned superconducting film and the opposite side of the wafer. The gold metal on the side of the wafer opposite from the patterned HTS film would be patterned by standard photolithography to avoid electrical contact to any of the conducting layers. This localized area of gold thus provides an electrical contact point for connection to integrated circuits.

The two substrates with defined HTS films are registered such that the metal bumps with solder are aligned and placed in physical contact. The aligned substrates are then heated to 300° C. in air to flow the solder and bond the aligned metal bumps.

EXAMPLE 10

A structure can be fabricated in the following manner.

Epitaxial high temperature superconducting thin films of $YBa_2Cu_3O_7$ are deposited on two single crystal lanthanum aluminate substrates. The depositions are done using off axis magnetron sputtering with the substrate heated to between 600° and 800° C. The final film thicknesses are between 0.1 and 1 micron.

The films are patterned by a standard bi-level photolithography process using ion beam etching. A photoresist etch mask is used to define the pattern on the HTS films. The bilevel photolith process utilized begins with coating the HTS films with KTI 496K molecular weight standard PMMA at 9% solids. The thickness should be approximately 1.2 microns. The PMMA is cured at 170° C. for 30 minutes. The PMMA is then coated with Shipley 1400-17 positive photoresist to a thickness of 0.5 micron. The resist is cured in air at 90° C. for 25 minutes. The 1400-17 is exposed to UV light in the range of 100 mJ per square centimeter. The 1400-17 is immersed in a 2:1 combination of Shipley MF312 developer to deionized water for 60 s. The photoresist is exposed to a low power oxygen plasma and descumed. The PMMA in open areas where the 1400-17 resist has been removed is exposed by flood exposure using a deep UV source with 10 J per square centimeter in the 220–260 nm range. The exposed PMMA is developed using toluene for 4 minutes.

The now exposed HTS film is etched by argon ion beam milling. In order to etch the channels in the substrate, the now exposed areas of the substrate are etched by continuing the ion beam milling process with the substrate etched at the rate of 10 nm/min. The remaining photoresist and PMMA are removed by solvents or oxygen plasma.

Conducting metal bump bonds of gold are photolithographically defined utilizing exactly the process described above and are deposited on the HTS film using DC or RF sputtering. The substrates with the defined metal bumps are annealed at 510° C. for 1 hour to ensure low metal to HTS contact resistance. The metal bumps are now pre-tinned with 80:20 AuSn alloy solder.

The sides of the substrates not having the patterned HTS film can be utilized for additional electrical purposes such as providing power, ground, and possibly other signal lines by depositing alternating layers of conducing material such as gold and insulator material such as strontium titanate. The gold can be deposited by DC or RF sputtering and the strontium titanate would be deposited by RF sputtering. These layers can be patterned by utilizing exactly the same patterning process as described above.

Any one of the conducting layers on the opposite side of the wafer from the patterned HTS film can be electrically connected to the patterned HTS film by producing conducting vias through the substrate. In the case where electrical contact to the layer closest to the substrate is desired, an opening would be formed in all of the layers on top of the bottom layer. The opening would be formed by photolithography and ion beam etching as described above and the size of the opening would be larger than the expected size of the via hole through the substrate. Next the via hole would be formed by excimer laser drilling through the bottom layer and the substrate to the patterned HTS film on the opposite side. The hole can then be coated with a conducting film of DC or RF sputtered gold metal to make electrical contact between the superconducting film and the conducting layer on the opposite side.

Electrical contacts to the patterned HTS film which are insulated from all of the conducting layers on the opposite side of the substrate from the patterned HTS films can also be provided. These contacts are produced by first forming an opening in all of the layers on the side of the substrate opposite from the patterned HTS film. The opening would be formed by photolithography and ion beam etching as described above and the size of the opening would be larger than the expected size of the via hole through the substrate. Next the via hole would be formed by excimer laser drilling through the substrate to the patterned HTS film on the opposite side. The hole can then be coated with a conducting film of DC or RF sputtered gold metal to make electrical contact between the patterned superconducting film and the opposite side of the wafer. The gold metal on the side of the wafer opposite from the patterned HTS film would be patterned by standard photolithography to avoid electrical contact to any of the conducting layers. This localized area of gold thus provides an electrical contact point for connection to integrated circuits.

For certain applications, it is desirable to use a dielectric material such as polyimide to fill all of the spaces between the two wafers which are to be bonded together by metal bumps. This structure is achieved by spin coating each wafer with a polyimide film after preparation of the gold metal bumps. The thickness of the polyimide layer should be 1.5 times the thickness of the metal bump. After spin coating, the polyimide film is baked at 100° C. for 30 minutes. After baking, the surface of the polyimide film is etched by an oxygen plasma until the surface of the gold bumps is exposed.

The two substrates with defined HTS films are registered such that the metal bumps with solder are aligned and placed in physical contact. The aligned substrates are then heated to 300° C. in air to flow the solder and bond the aligned metal bumps.

What is claimed is:

1. A process for producing an electrical interconnect structure comprising:

(1) forming a substructure A by:
      (a) depositing onto a substrate, a first electrically conducting film which can serve as a power plane or ground plane;
      (b) depositing a layer of dielectric material onto the electrically conducting film; and
      (c) depositing a second electrically conducting film which can serve as a ground plane or power plane onto the layer of dielectric material; and (2) forming a substructure B by:
      (a) depositing a high temperature superconducting film onto a first single crystal substrate chosen to provide epitaxial growth for said superconducting film and patterning the superconducting film to form a first patterned signal layer;

(b) forming metal contact pads onto the first patterned signal layer;

(3) bonding the exposed patterned signal layer of substructure B to the exposed electrically conducting film of substructure A with a dielectric material having a thickness of at least 2 μm and a dielectric constant of less than about 5;

(4) reducing the thickness of the first single crystal substrate to a maximum thickness of about 25 μm;

(5) forming a substructure C by:
   (a) depositing a high temperature superconducting film onto a second single crystal substrate chosen to provide epitaxial growth for the superconducting film and patterning the superconducting film to form a second patterned signal layer;
   (b) forming metal contact pads onto the second patterned signal layer;

(6) bonding the exposed patterned signal layer of substructure C to the reduced first single crystal substrate of combined substructures A and B with a dielectric material a dielectric constant of less than about 5;

(7) producing holes through the top surface of the combined substructures A, B, and C to the ground plane, power plane, and signal layers; and (8) depositing metal into the holes produced in (7) to provide vias to said planes and layers to yield an electrical interconnect structure.

2. The process of claim 1 wherein the thickness of the second single crystal substrate is reduced to a maximum thickness of about 25 μm.

3. The process of claim 1 wherein the electrically conducting films in substructure A are superconducting oxides and metal contact pads are formed on said films by producing holes through the second electrical conducting layer and the dielectric material to the first electrically conducting layer, and depositing metal therein and annealing prior to bonding substructure A to substructure B.

4. The process of claim 1 wherein the dielectric material in substructure A has a dielectric constant of at least about 5.

5. The process of claim 1 further comprising bonding to combined substructures A, B, and C an additional signal layer substructure or an additional base substructure or both additional signal layer substructures and additional base substructures with dielectric material have a dielectric constant of less than about 5.

6. The process of claim 1 wherein the dielectric material bonding the substructures to one another is a polymer.

7. The process of claim 6 wherein said polymer is a fluoropolymer or a polyimide.

8. The process of claim 1 wherein the power plane and the ground plane are epitaxially grown high temperature superconductors and the substrate of the substructure A is a single crystal of $LaAlO_3$, MgO, sapphire, $NdGaO_3$ or yttrium stabilized zirconia.

9. The process of claim 1 wherein the single crystal substrates of the signal layers are $LaAlO_3$, MgO, sapphire or $NdGaO_3$.

10. An electrical interconnect structure prepared by the process of claim 1.

11. A process for producing an electrical interconnect structure comprising:

(1) forming a substructure D by:
   (a) depositing a high temperature superconducting film onto a first single crystal substrate chosen to provide epitaxial growth for the superconducting film and patterning the film to form a first patterned signal layer;
   (b) forming metal contact pads onto the first patterned signal layer;
   (c) depositing a dielectric material having a dielectric constant of less than about 5 by epitaxial growth onto the first patterned signal layer and any exposed substrate;
   (d) depositing a high temperature superconducting film onto the dielectric material by epitaxial growth and patterning the film to form a second patterned signal layer;
   (e) forming metal contact pads onto the second patterned signal layer to yield the substructure A;

(2) forming a substructure A by:
   (a) depositing onto a substrate a first electrically conducting film which can serve as a power plane or ground plane;
   (b) depositing a layer of dielectric material onto the electrically conducting film;
   (c) depositing a second electrically conducting film which can serve as a ground plane or power plane onto the layer of dielectric material;

(3) bonding the exposed patterned signal layer of substructure D to the exposed electrically conducting film of substructure A with a layer of dielectric material having a thickness of at least 2 μm and a dielectric constant of less than about 5; and (4) producing holes through the top surface (reduced first crystal substrate) of the combined substructures D and A to the power plane, ground plane, and signal layers and depositing metal into the holes to provide vias to said planes and layers to yield the electrical interconnect structure.

12. The process of claim 11 wherein the thickness of the first single crystal substrate is reduced to a maximum thickness of about 5 μm.

13. The process of claim 11 wherein the dielectric layer bonding the substructures to one another is a polymer.

14. The process of claim 13 wherein said polymer is a fluoropolymer or a polyimide.

15. The process of claim 11 wherein the power plane and the ground plane are epitaxially grown high temperature oxide superconductors and the substrate of the substructure A is a single crystal of $LaAlO_3$, MgO, sapphire, $NdGaO_3$ or yttrium stabilized zirconia.

16. The process of claims 11 wherein the single crystal substrates of the signal layer substructures are $LaAlO_3$, MgO, sapphire, or $NdGaO_3$.

17. An electrical interconnect structure prepared by the process of claim 11.

* * * * *